(12) United States Patent
Kim et al.

(10) Patent No.: US 7,034,343 B1
(45) Date of Patent: Apr. 25, 2006

(54) DIPOLAR SIDE-EMITTING LED LENS AND LED MODULE INCORPORATING THE SAME

(75) Inventors: Jin Ha Kim, Kyungki-do (KR); Hun Joo Hahm, Kyungki-do (KR); Hyung Suk Kim, Kyungki-do (KR); Jin Jong Kim, Kyungki-do (KR); Joo Hee Jun, Seoul (KR); Sang Hyuck Lee, Kyungki-do (KR); Chon Su Kyong, Seoul (KR); Ho Seop Jeong, Kyungki-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 11/085,534

(22) Filed: Mar. 21, 2005

(30) Foreign Application Priority Data

Oct. 20, 2004 (KR) .................... 10-2004-0084120

(51) Int. Cl.
 *H01L 31/12* (2006.01)
(52) U.S. Cl. .......................... 257/98; 257/79
(58) Field of Classification Search .......... 257/98, 257/100, 290, 291, 292, 293, 294, 431, 288, 257/432, 433, 434, 435, 436, 437; 362/307, 362/308, 309, 326, 327
See application file for complete search history.

(56) References Cited

U.S. PATENT DOCUMENTS 6,507,049 B1 * 1/2003 Yeager et al.
6,679,621 B1 * 1/2004 West et al.

* cited by examiner

*Primary Examiner*—Nathan J. Flynn
*Assistant Examiner*—Kevin Quinto
(74) *Attorney, Agent, or Firm*—Volpe and Koenig, P.C.

(57) ABSTRACT

The present invention relates to a dipolar LED and a dipolar LED module incorporating the same, in which an upper hemisphere-shaped base houses an LED chip therein and adapted to radiate light from the LED chip to the outside, and a pair of reflecting surfaces placed at opposed top portions of the base in a configuration symmetric about an imaginary vertical plane. The vertical plane passes through the center of the LED chip perpendicularly to a light-emitting surface of the LED chip. The reflecting surfaces are extended upward away from the top portions of the base to reflect light from the LED chip away from the imaginary vertical plane. A pair of radiating surfaces are placed outside the reflecting surfaces, respectively, to radiate light from the reflecting surfaces to the outside. In this way, light emission from the LED chip can be concentrated in both lateral directions.

20 Claims, 12 Drawing Sheets

DIPOLAR SIDE-EMITTING LED LENS AND LED MODULE INCORPORATING THE SAME

RELATED APPLICATION

The present application is based on, and claims priority from, Korean Application Number 2004-84120, filed Oct. 20, 2004, the disclosure of which is hereby incorporated by reference herein in its entirety.

BACKGROUND OF THE INVENTION

1. Field of the Invention

The present invention relates to a Light Emitting Diode (LED), and more particularly, to a dipolar LED structured to concentrate light emission in both lateral directions and an LED module incorporating the same.

2. Description of the Related Art

According to the development of electronic devices, Liquid Crystal Displays are gaining attention as next generation display devices. Since an LCD does not light spontaneously, it is required to provide a backlight unit for generating light in rear of an LCD panel.

Figure 1:
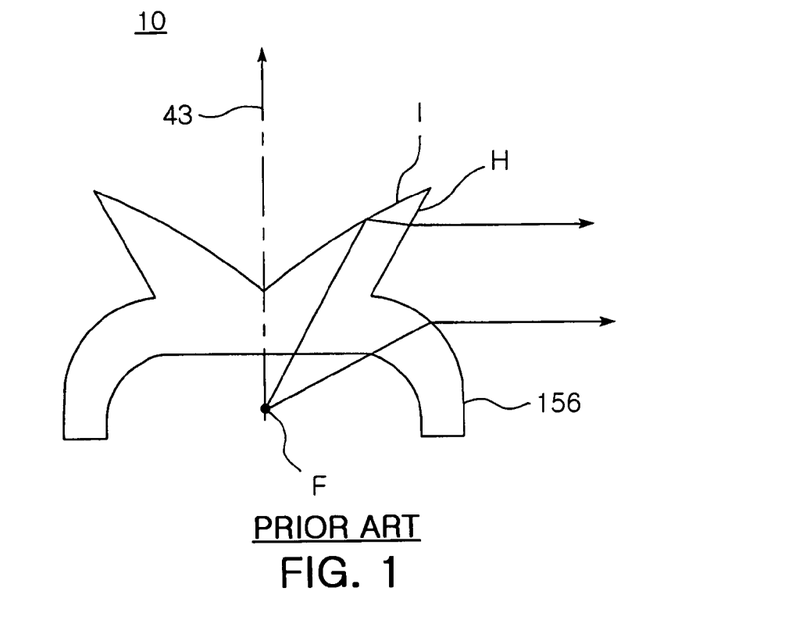
FIG. 1 is a cross-sectional view of a conventional LED lens.

FIG. 1 is a cross-sectional view illustrating a Light Emitting Diode (LED) lens disclosed in U.S. Pat. No. 6,679,621 as an example of a conventional side-emitting LED used in the LCD backlight unit.

Referring to FIG. 1, an LED lens 10 disclosed in the above document includes an upper part having a reflecting surface I and a refractive surface H and a lower part having a refractive surface 156. In a three dimensional view, the LED lens 10 is configured symmetric about an optical axis 43.

In this LED lens 10, light generated from a focal point F is radiated to the outside through the refracting surface H after reflecting from the reflecting surface I or directly through the refracting surface H.

However, the conventional LED lens 10 has following drawbacks.

Figure 2:
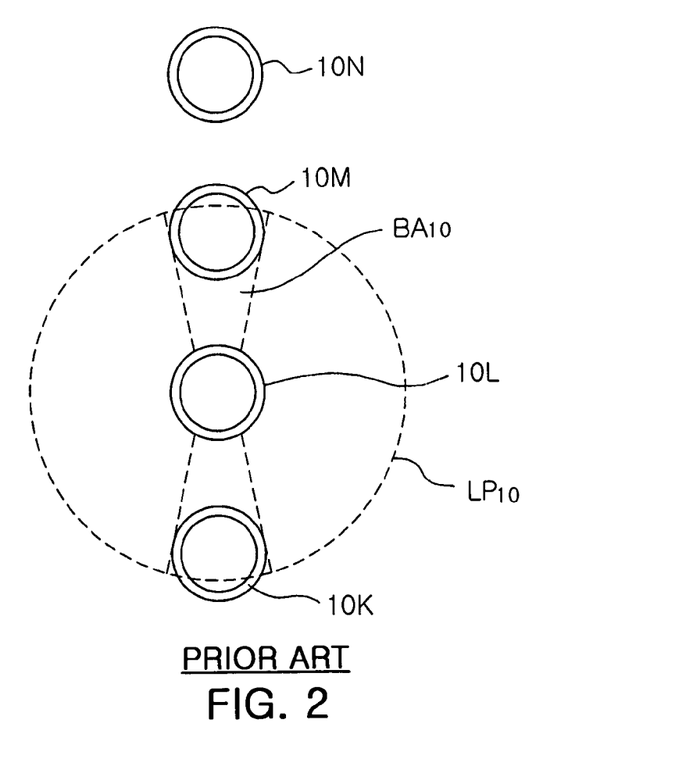
FIG. 2 is a plan view of an array of conventional LED lenses for illustrating drawbacks of the LED lens.

First, in an LED array including a plurality of LED lenses 10K, 10L, 10M, 10N and so on as shown in FIG. 2, when an LED lens 10L has a light radiation pattern or simply a light pattern $LP_{10}$ as shown in FIG. 2, a portion of light directly collides against adjacent LED lenses 10K and 10M so that the adjacent LED lenses 10K and 10M screen the light portion thereby forming blocked areas $BA_{10}$. The blocked area $BA_{10}$ causes loss to light emitted from the LED lens 10L. Then, the LEDs are necessarily increased in number corresponding to the light loss by the blocked areas $BA_{10}$, thereby obstructing the miniaturization of the LCD backlight.

Another problem of the conventional LED lens 10 will be described with reference to FIG. 3.

Figure 3:
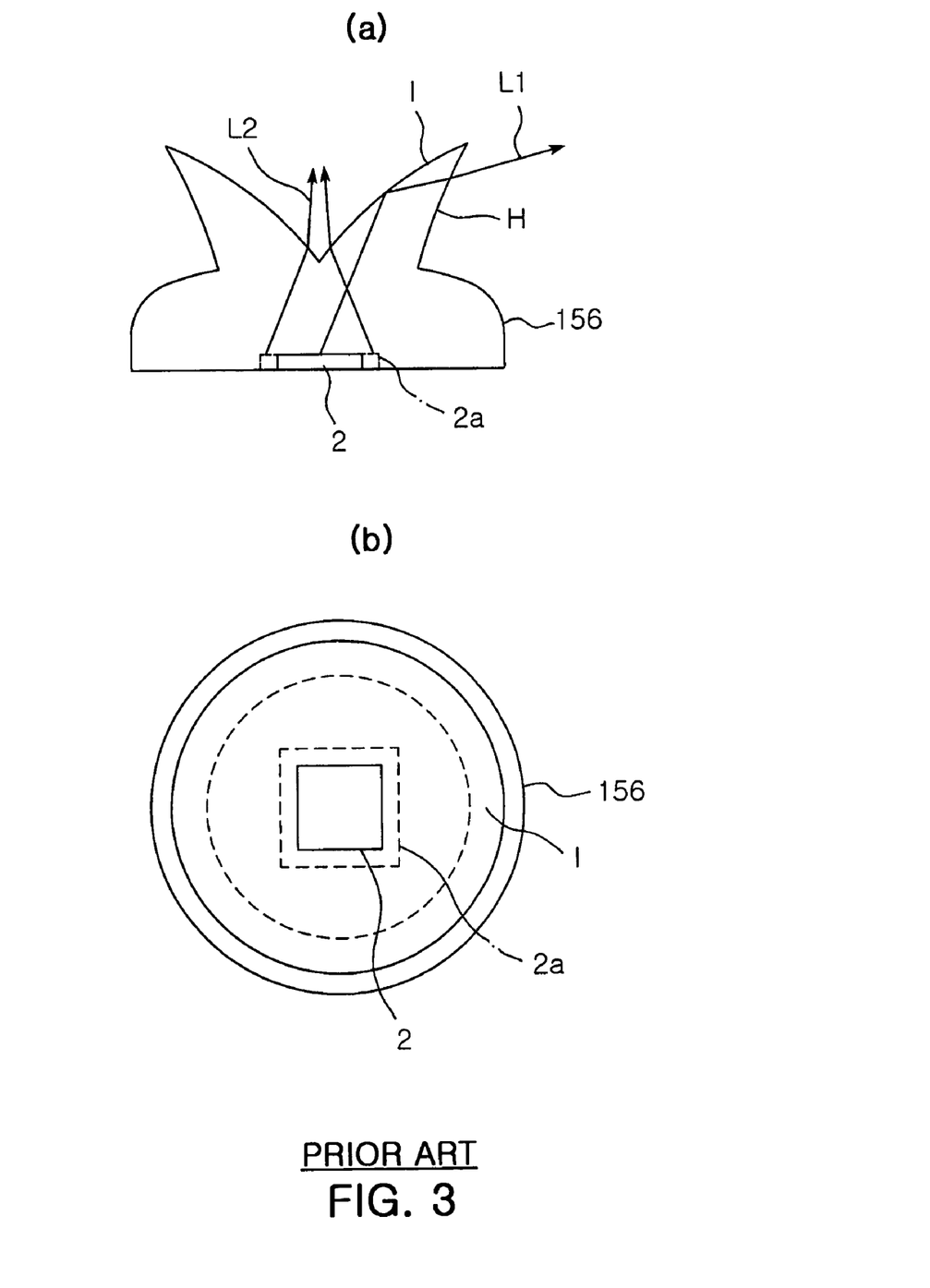
FIG. 3 is cross-sectional and plan views of a conventional LED lens for illustrating drawbacks of the LED lens.

As shown in FIG. 3, it is frequently required to increase the size of an LED chip 2a over that of the existing LED chip 2 in order to reduce current density thereby improving luminous efficiency. However, light beams L2 generated in the periphery of the LED chip 2a are out of total reflection condition and thus emitted upward without reflecting from the reflecting surface I. This disadvantageously lowers the color uniformity of an entire LCD backlight module. Although the poor uniformity can be improved by increasing the size of the LED lens 10, the increased LED lens size also creates a problem of increasing the thickness of the LCD backlight unit.

SUMMARY OF THE INVENTION

The present invention has been made to solve the foregoing problems of the prior art, and it is therefore an object of the present invention to provide a dipolar LED and an LED module incorporating the same, by which when light beams are emitted from an LED array having a plurality of LED lenses, light emission from an LED chip can be concentrated mainly in both lateral directions in order to prevent any blocked areas from being formed between adjacent LED lenses.

It is another object of the invention to provide a dipolar LED and an LED module incorporating the same which are structured to concentrate light emission from an LED chip mainly in both lateral directions in order to increase the size of the LED chip in a direction substantially perpendicular to the concentrated light emission thereby lowering current density in high power conditions and thus improving luminous efficiency.

According to an aspect of the invention for realizing the object, there is provided a dipolar LED lens comprising: an upper hemisphere-shaped base housing an LED chip therein and adapted to radiate light from the LED chip to the outside; a pair of symmetric reflecting surfaces, each reflecting surface having a proximal end placed on top of the base and a distal end extended upward and away from the base, which the proximal ends of the reflecting surfaces meeting each othr in the form of a joint line on the top of the base, forming a V-shaped valley extended along the joint line between the reflecting surfaces, whereby light from the LED chip is reflected by the reflecting surfaces in a dipolar pattern symmetric about the joint line; and a pair of radiating surfaces placed outside the reflecting surfaces, respectively, to radiate light from the reflecting surfaces to the outside, thereby forming a peanut-shaped light radiation pattern.

The dipolar LED lens may further comprise triangular side surfaces confined by the reflecting surfaces, the radiating surfaces and the base top portions.

Preferably, the reflecting surfaces are curved downward, upward or planar.

Preferably, the reflecting surfaces are widened as extending away from the base top portions.

Preferably, the base has a hemispheric space formed in a lower part thereof, the space being opened downward at a uniform curvature.

According to another aspect of the invention for realizing the object, there is provided a dipolar Light Emitting Diode (LED) module comprising: an LED chip; a board mounted with the LED chip; a power-connecting unit for electrically connecting the LED chip with an external power source; and an LED lens as described above for sealing the LED chip therein and radiating light from the LED chip to the outside.

Preferably, the base has a hemispheric space formed in a lower part thereof, the space being opened downward at a uniform curvature.

The bipolar LED module may further comprise an encapsulant housing the LED chip within the space of the base and integrally bonded with the LED chip, the encapsulant having a curvature matching that of the space.

Preferably, the lens is provided separate from the encapsulant.

The bipolar LED module may further comprise an encapsulant placed inside the lens to house the LED chip and integrally bonded with the LED chip.

Preferably, any of the encapsulants comprises polymer having a refractive index of about 1.45 to 1.65.

Preferably, any of the encapsulants comprises nano-sized particles uniformly dispersed through the polymer, the nano-sized particles having a refractive index of about 2.2 to 3.5.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in more detail with reference to the accompanying drawings.

Figure 4:
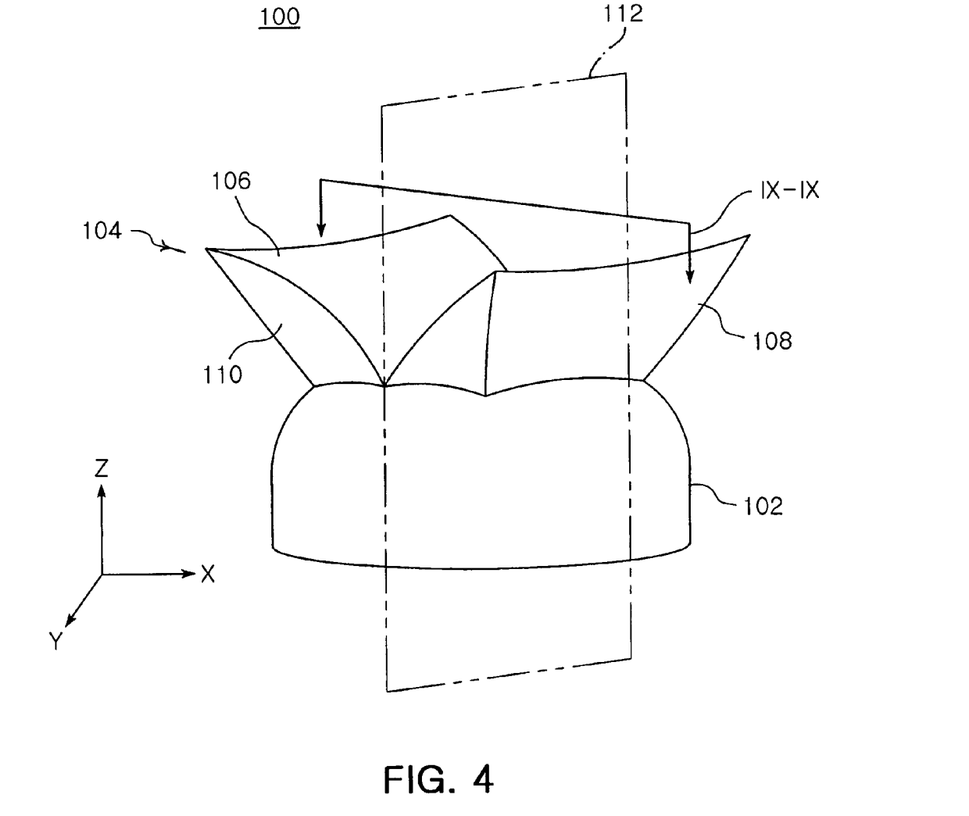
FIG. 4 is a perspective view of an LED lens according to a first embodiment of the invention.
Figure 5:
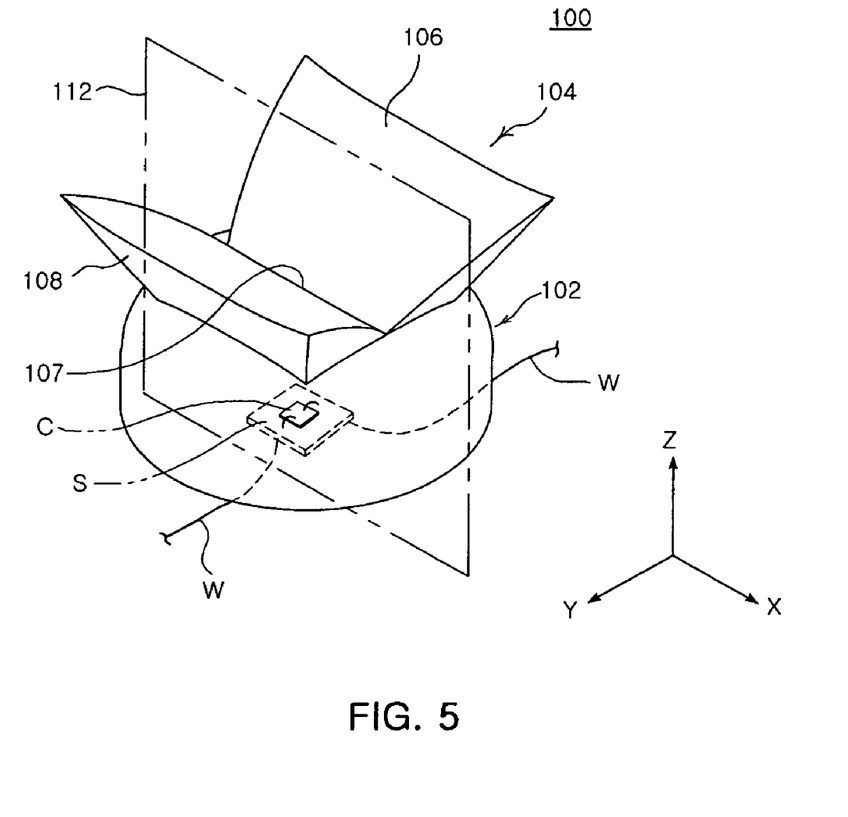
FIG. 5 is a perspective view of the LED lens shown in FIG. 4 which is arranged in a different orientation.
Figure 6:
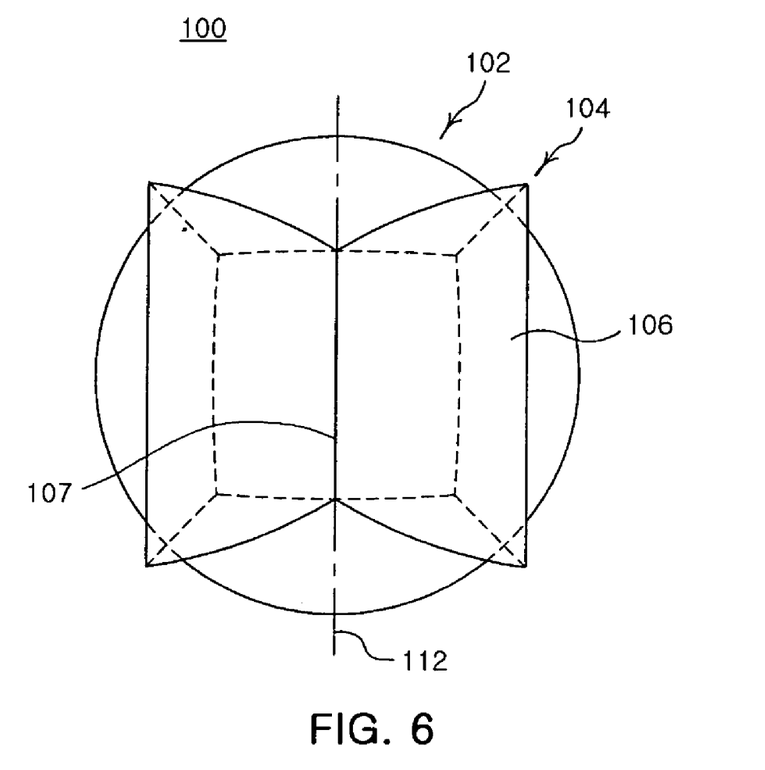
FIG. 6 is a plan view of the LED lens shown in FIG. 4.
Figure 7:
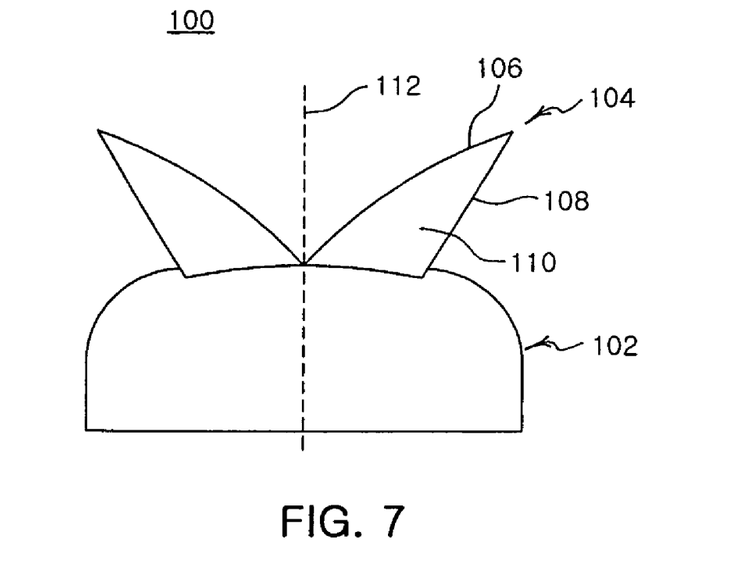
FIG. 7 is a front elevation view of the LED lens shown in FIG. 4.
Figure 8:
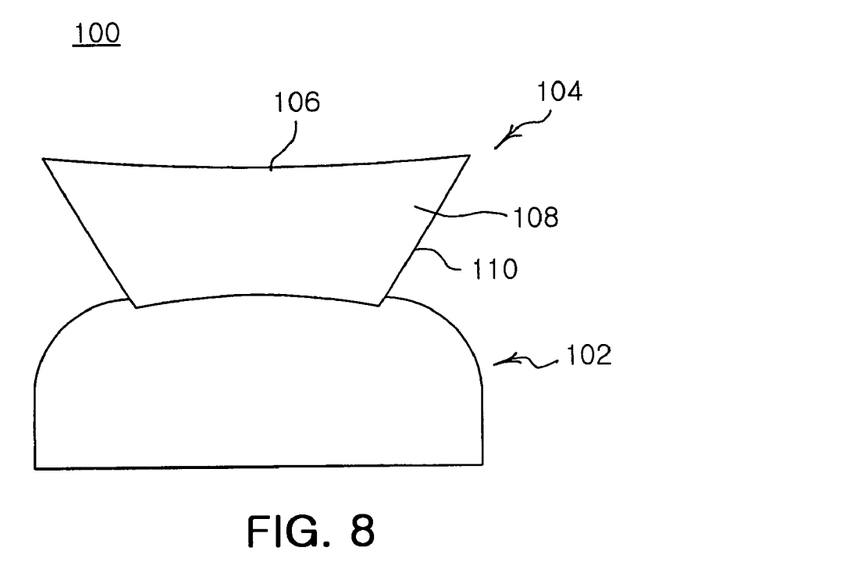
FIG. 8 is a side elevation view of the LED shown in FIG. 4.

FIG. 4 is a perspective view of an LED lens according to a first embodiment of the invention, FIG. 5 is a perspective view of the LED lens shown in FIG. 4 which is arranged in a different orientation, FIG. 6 is a plan view of the LED lens shown in FIG. 4, FIG. 7 is a front elevation view of the LED lens shown in FIG. 4, and FIG. 8 is a side elevation view of the LED shown in FIG. 4.

Referring FIGS. 4 to 8, an LED lens 100 of the invention comprises a unitary body made of transparent material, and includes an upper hemisphere-shaped base 102 and a pair of opposite wings 104 projected from opposite top portions of the base 102.

The base 102 is generally shaped as a hemisphere to receive an LED chip C therein while radiating light generated by the LED chip C to the outside.

The wings 104 are configured symmetric about an imaginary vertical plane that passes through the center of the LED chip C or the base 102 and perpendicularly crosses a light emitting surface or top surface of the LED chip C. In this case, the imaginary plane 102 generally crosses the underside of the base 102. In addition, each of the wings 104 includes a reflecting surface 106 having a proximal end on top of the base 102 and a distal end extended upward and away from the base to outwardly reflect light incident from the LED chip C in a direction substantially perpendicular to the imaginary plane 112, a radiating surface 108 arranged outside the reflecting surface 106 to outwardly radiate light reflecting from the reflecting surface 106 and a pair of opposed side surfaces 110 formed between the reflecting surface 106 and the radiating surface 108.

The proximal ends of the reflecting surfaces 106 meet together on the top of the base 102 in the form of a joint line 107, which is on the vertical plane 112. In this way, the reflecting surfaces 106 form a V-shaped valley along the joint line 107 between them.

The reflecting surface 106 is connected at the bottom with the top of the base 102, and has an arc-shaped cross-section that widens as extending to the top thereof. The radiating surface 108 is connected at the bottom with the top of the base 102, and has an arc-shaped cross-section that widens as extending to the top thereof. The radiation surface 108 is connected at the top with the top of the reflecting surface 106. In this case, the top edges of the reflecting and radiating surfaces 106 and 108 are slightly curved downward as apparent from FIG. 8. The side surfaces 110 are connected at the bottom with the top of the base 102, and extended upward between the reflecting and radiating surfaces 106 and 108. As the side surfaces 110 extend upward, the width of the side surfaces 110 is reduced thereby defining a substantially triangular area.

In the LED lens 100, the base 102 radiates light incident directly from the LED chip C to the outside by refracting most light. In the wings 104, the reflective surfaces 106 reflect most light incident directly from the LED chip C toward the radiating surfaces 108 so that the radiating surfaces radiate reflection light to the outside by refracting most reflection light. Accordingly, when light is generated from the LED chip C, a portion of light spreads out radially through the base 102 but another portion of light is spread out by the wings 104 in opposite directions substantially perpendicular about both faces of the imaginary vertical plane 112.

Figure 9:
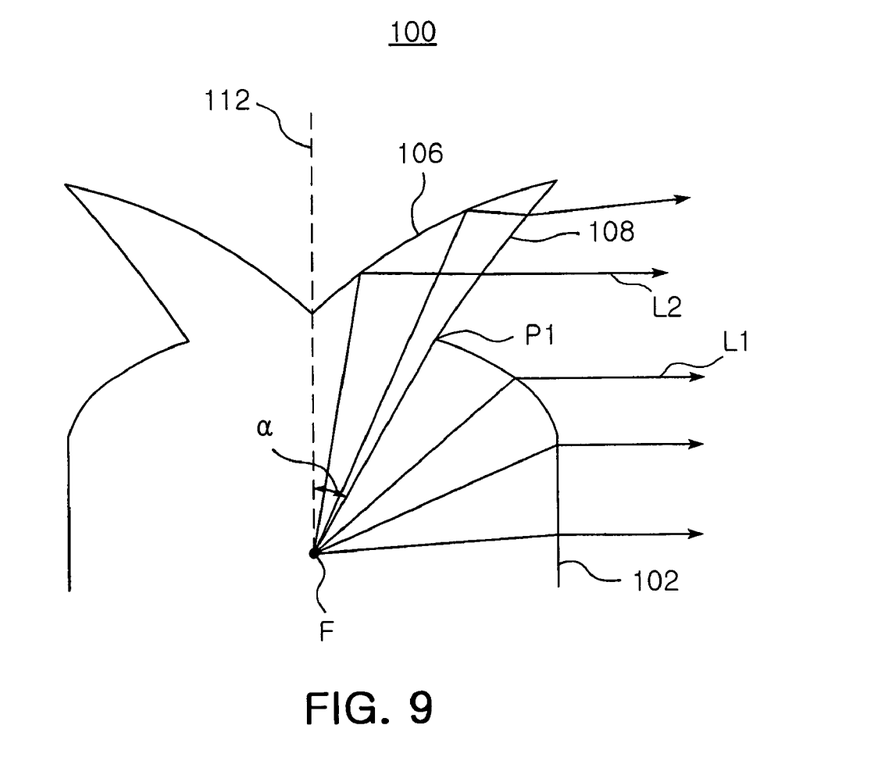
FIG. 9 is a cross-sectional view of the LED lens shown in FIG. 4 taken along the line IX—IX in FIG. 4 for illustrating reflection and refraction in a cross-section of the LED lens.
Figure 10:
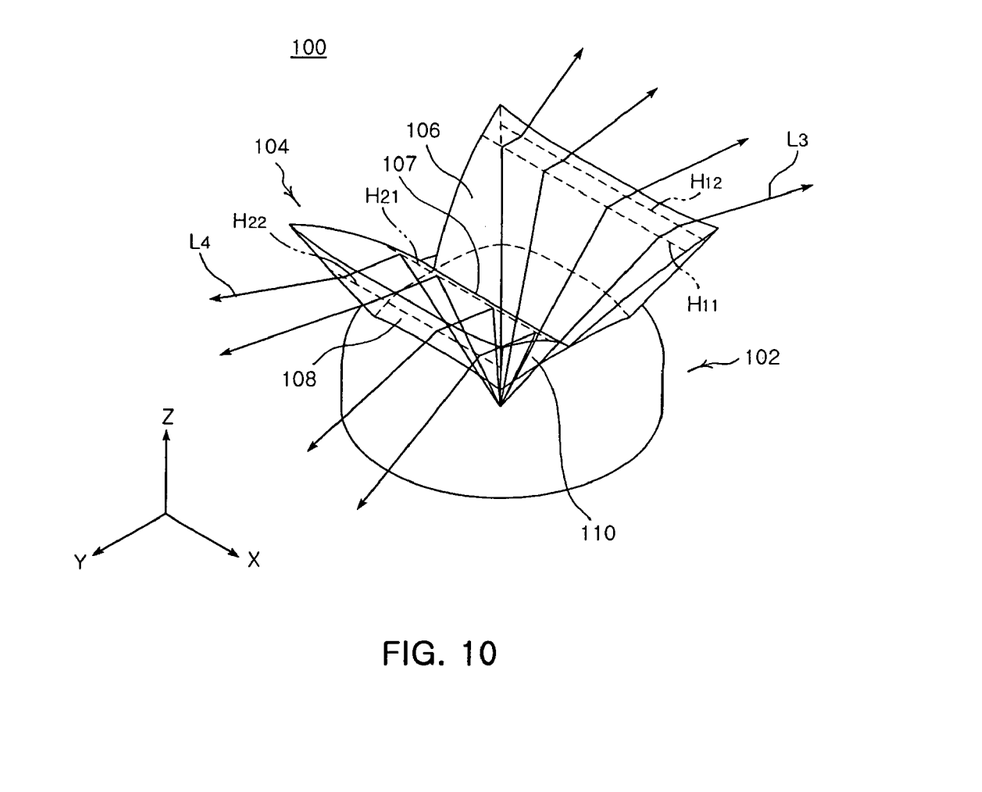
FIG. 10 is a perspective view for illustrating reflection and refraction in a lens wing of the LED lens shown in FIG. 4.
Figure 11:
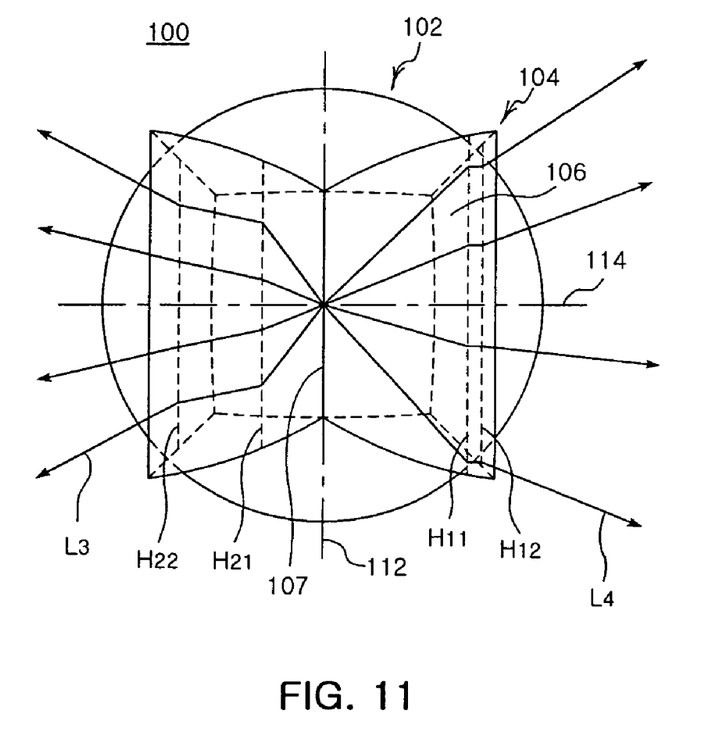
FIG. 11 is a plan view of the LED lens shown in FIG. 10.

Such radiation of light through reflection and refraction will be described in more detail with reference to FIGS. 9 to 11, in which FIG. 9 is a cross-sectional view of the LED lens shown in FIG. 4 taken along the line IX—IX in FIG. 4 for illustrating reflection and refraction in a cross-section of the LED lens, FIG. 10 is a perspective view for illustrating reflection and refraction in a lens wing of the LED lens shown in FIG. 4, and FIG. 11 is a plan view of the LED lens shown in FIG. 10.

In description of the path of light generated from the LED chip (not shown) in the LED lens 100 during the activation of the LED, it is assumed for the convenience's sake that the LED chip is a point light source designated with a focal point F and light is generated entirely from the focal point F.

First, referring to FIG. 9, a group of light beams L1 generated from the focal point F within the LED lens 100 are radiated through the outer surface of the base 102, and another group of light beams L2 directed within a predetermined angle θ with respect to the imaginary vertical plane 112 are reflected from the reflecting surface 106 and then outwardly radiated via the radiating surface 108. Through such refraction and reflection, an overall light pattern is formed in a substantially horizontal direction of the drawing.

Referring to FIG. 10, light beams L3 from the focal point F are reflected from a horizontal line H11 on the right reflecting surface 106, and then outwardly radiated through a horizontal line H12 on the right radiation surface 108. Also, light beams L4 are reflected from a horizontal line H21 on the left reflecting surface 106, and then radiated to the outside via the left radiating surface 106.

When depicted in a plan view, as shown in FIG. 11, the light beams L3 and L4 converge toward an axial line 114 that is perpendicular to the imaginary vertical plane 112. That is, the light beams emitted in various angles from the focal point F are reflected from the reflecting surfaces 106 and then converge generally toward the axial line 14 in opposite directions.

As a result, when the light beams L3 and L4 are emitted upward within a predetermined angle range from the focal point F, the wings 102 converge the light beams L3 and L4 toward the axial line 114 so as to block or at least minimize the propagation of the light beams L3 and L4 across the axial line 114.

Although not shown in the drawing, light beams directed toward the wings 104 are incident onto the side surfaces 110 before the reflecting surfaces 106. In this case, a portion of each side surface 110 adjacent to the base 102 refracts a light beam toward the axial line 114 along a nearby side surface 110 while radiating the light beam to the outside. In addition, a portion of each side surface 110 adjacent to each radiating surface 108 reflects a light beam to the radiating surface 108 or to the reflecting surface 106, from which the light beam is reflected again toward the radiating surface 108. In this way, the light beam is radiated to the outside via the radiating surface 108, refracted toward the axial line 114 along the side surface 110. Accordingly, it can be seen that the light beams incident onto the side surfaces 110 are also redirected toward the axial line 114.

Figure 12:
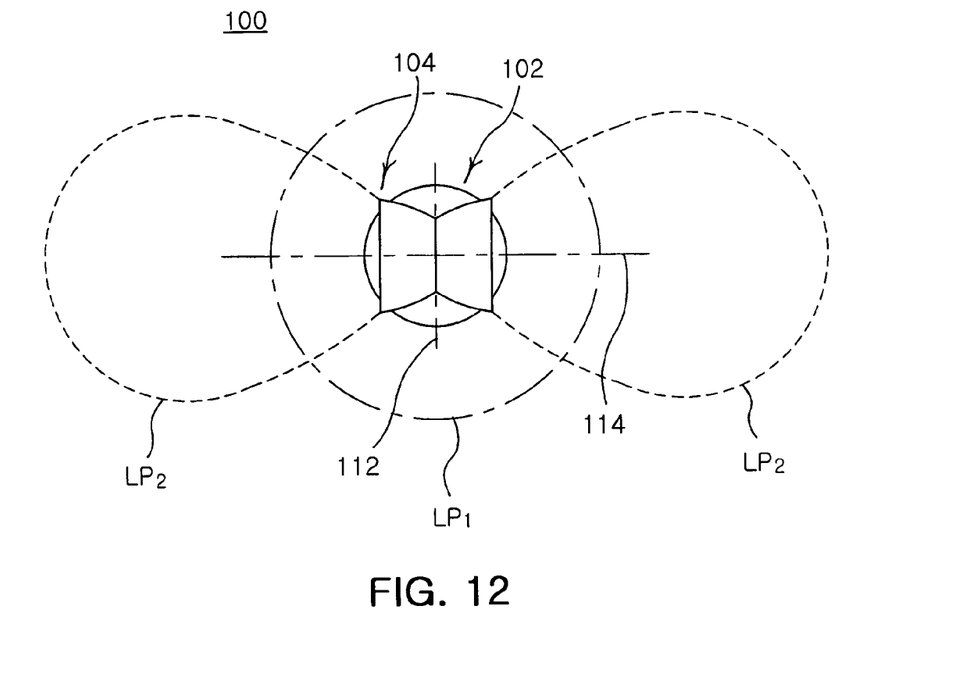
FIG. 12 is a plan view illustrating a light pattern produced by an LED lens of the invention.

Light refracted and reflected by the base 102 and the wings 104 as above makes a peanut-shaped light pattern as shown in FIG. 12. As depicted in the plan view of FIG. 12, when light beams radiate out through the base 102, they are substantially refracted and uniformly spread out making a circular light pattern LP1. On the other hand, light beams reflected/refracted by the wings 104 converge to the axial line 114 perpendicular to the imaginary vertical plane 112, thereby making a dipolar light pattern LP2.

Accordingly, light from the LED chip (not shown) has a higher density along the axial line 114 but a lower density along the imaginary vertical plane 102 crossing the axial line 114, thereby forming the dipolar light pattern LP2 as described above.

Figure 13:
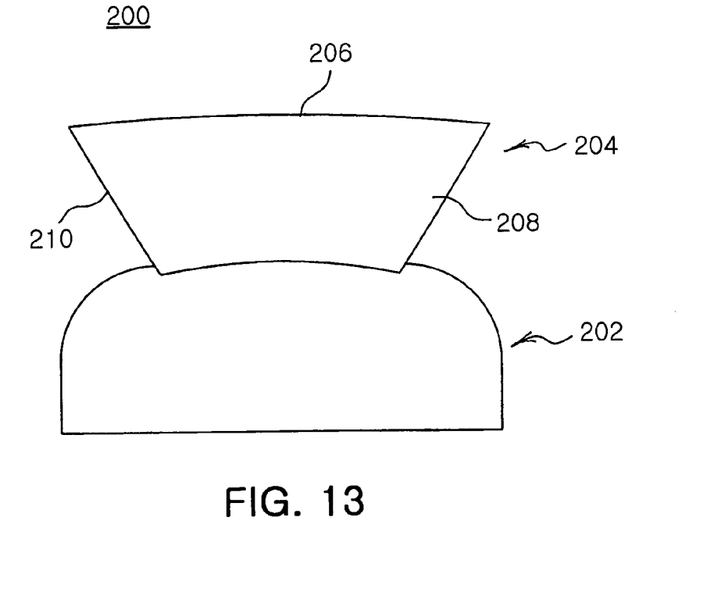
FIG. 13 is a side elevation view of a first alternative to the LED lens according to the first embodiment of the invention.

FIG. 13 is a side elevation view of a first alternative to the LED lens according to the first embodiment of the invention. Referring to FIG. 13, an LED lens 200 is substantially the same as the afore-described LED lens 100 of the first embodiment except that a reflecting surface 206 is curved upward.

According to the reflecting surface 206 of this configuration, when light beams are reflected from the reflecting surface 206 as in FIGS. 10 and 11, they are more converged toward an axial line (cf. the axial line 114) compared to the LED lens 100. Accordingly, the LED lens 200 produces a light pattern formed longer along the axial line (cf. 114 in FIG. 12).

Figure 14:
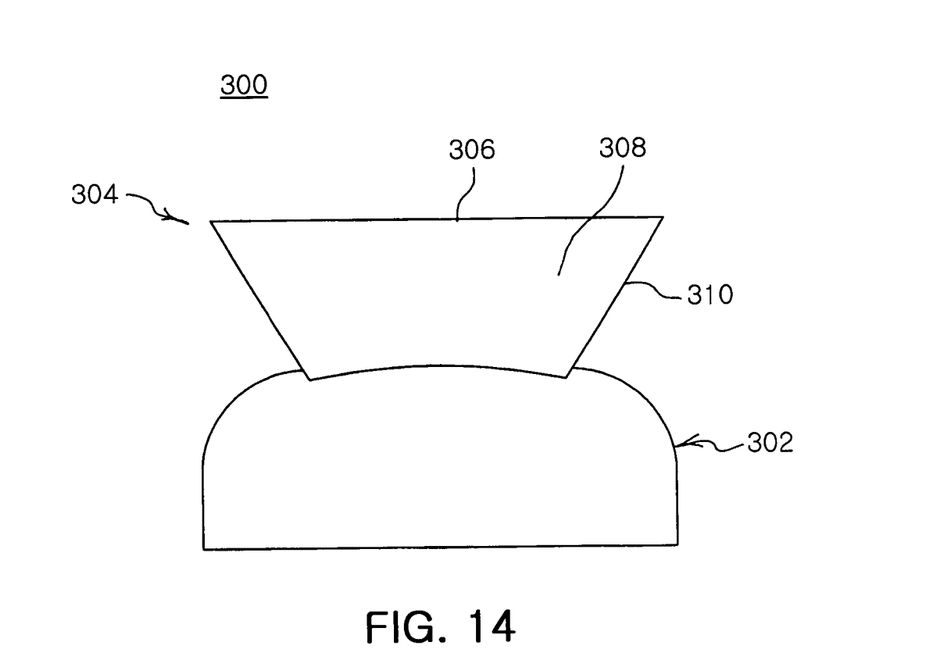
FIG. 14 is a side elevation view of a second alternative to the LED lens according to the first embodiment of the invention.

FIG. 14 is a side elevation view of a second alternative to the LED lens according to the first embodiment of the invention. Referring to FIG. 14, an LED 300 is substantially the same as the LED lenses 100 and 200 except that a reflecting surface 306 is formed substantially flat.

According to the reflecting surface 306 of this configuration, when light beams are reflected from the reflecting surface 306 as in FIGS. 10 and 11, they are more converged toward an axial line (cf. the axial line 114) compared to the LED lens 100 but less than the first alternative LED lens 200. Accordingly, the LED lens 300 produces a light pattern formed intermediating between those of the LED lenses 100 and 200.

Alternatively, the LED lenses 100, 200 and 300 may have a wing structure different from the above. For example, although the wings have the reflecting surface, the radiating surface and the side surfaces between the reflecting and radiating surfaces, the reflecting surface may be suitably curved at both lateral edges to directly connect with the radiating surface and vice versa to realize the object of the invention.

An LED module of the invention may be realized by adopting any of the LED lenses 100, 200 and 300 of the above structure. As designated with dotted lines in FIG. 5, the LED module of the invention includes an LED chip C contained within any of the LED lenses 100, 200 and 300, a substrate S mounted with the LED chip C and electric connectors W for electrically connecting the LED chip C with an external power source (not shown). The LED module may also include a reflector mounted on the substrate S for reflecting light generated by the LED chip in an upward direction.

In addition, the LED module may further include an encapsulant of a predetermined curvature to seal the LED chip inside the LED lens 100, 200, 300. The encapsulant has a curvature similar to, preferably the same as that of the LED lens 100, 200, 300.

The encapsulant may be made of silicone. Alternatively, the encapsulant may be made of polymeric material having a refractive index of about 1.45 to 1.65, or contain nano-sized particles of a higher refractivity material that is uniformly dispersed therein. Suitable examples of the higher refractivity material may include $TiO_2$, $ZrO_2$ and so on, in which $TiO_2$ has a refractive index of 3.1, and $ZrO_2$ has a refractive index of 2.2. Such a high refractivity material may change the refractivity of the encapsulant up to about 1.7 to 2.5 when added into the polymeric material. With raised refractivity as above, such an encapsulant can prevent the degradation of light extraction efficiency caused by a conventional encapsulant, in which the conventional encapsulant reflects light from the LED chip owing to low refractive index.

In addition, the encapsulant may be made utilizing polymer chains bonded with inorganic material having high refractivity.

Figure 15:
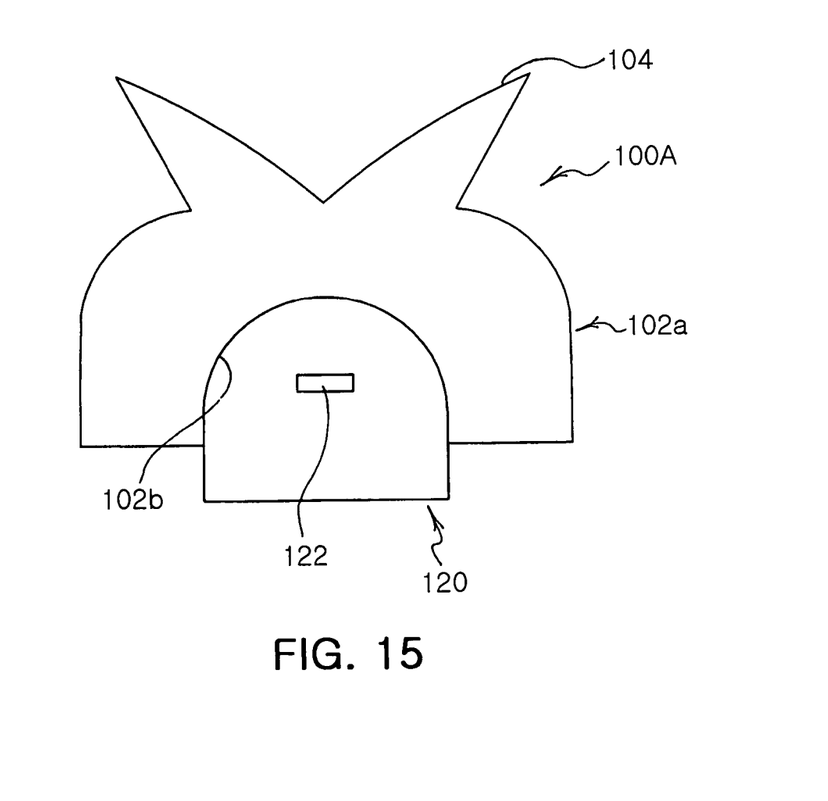
FIG. 15 is a cross-sectional view of an LED module according to a second embodiment of the invention.

FIG. 15 is a cross-sectional view of an LED module according to a second embodiment of the invention. The LED module shown in FIG. 15 includes an LED 120 having a hemispheric encapsulant and an LED diode lens 100A according to a second embodiment of the invention for housing an upper portion of the LED 120. The LED lens 100A has a base 102a with a hemispheric space 102b formed therein and wings 104 configured the same as those of the LED lens 100 of the first embodiment. Accordingly, the LED lens 100A has a structure substantially the same as that of the LED lens 100 except for the hemispheric space 102b.

In the LED 120, the transparent encapsulant for sealing an LED chip 122 therein has a refractive index similar to, preferably, the same as that of the base 102a of the LED lens 100A. Although not shown, the LED 120 includes a reflector for reflecting light generated by the LED chip 122 in an upward direction, a substrate mounting with the LED chip 122 and the reflector and electric connectors for electrically connecting the LED chip 122 with an external power source.

The encapsulant may be made of silicone. Alternatively, the encapsulant may be made of polymeric material having a refractive index of about 1.45 to 1.65, or contain nano-sized particles of a higher refractivity material that is uniformly dispersed therein. Suitable examples of the higher refractivity material may include those as described about the LED of the first embodiment. In addition, the encapsulant may be made utilizing polymer chain bonded with inorganic material having high refractivity.

Since the LED lens 100A adopted in the LED 120 as above has a structure the same as the afore-described LED lens 100 except that the hemispheric space 102b is formed inside the LED lens 100A, the LED lens 100A combined with an LED can realize functions and effects the same as described about the LED lens 100. Accordingly, the invention has an advantage in that those effects of the invention can be also realized by capping a general LED with the LED lens 100A.

The LED lens 100A is fabricated separate from an LED and can be selectively separated/combined from/to the LED, and thus can be conveniently applied thereto.

In the meantime, the LED lens 100A of this embodiment can be modified to have the wing configurations of FIGS. 13 and 14 and then capped on a conventional LED.

Alternatively, the LED lens 100A may have a wing structure different from the above. For example, although each wing has a reflecting surface, a radiating surface and side surfaces between the reflecting and radiating surfaces, the reflecting surface may be suitably curved at both lateral edges to directly connect with the radiating surface and vice versa to realize the object of the invention.

Figure 16:
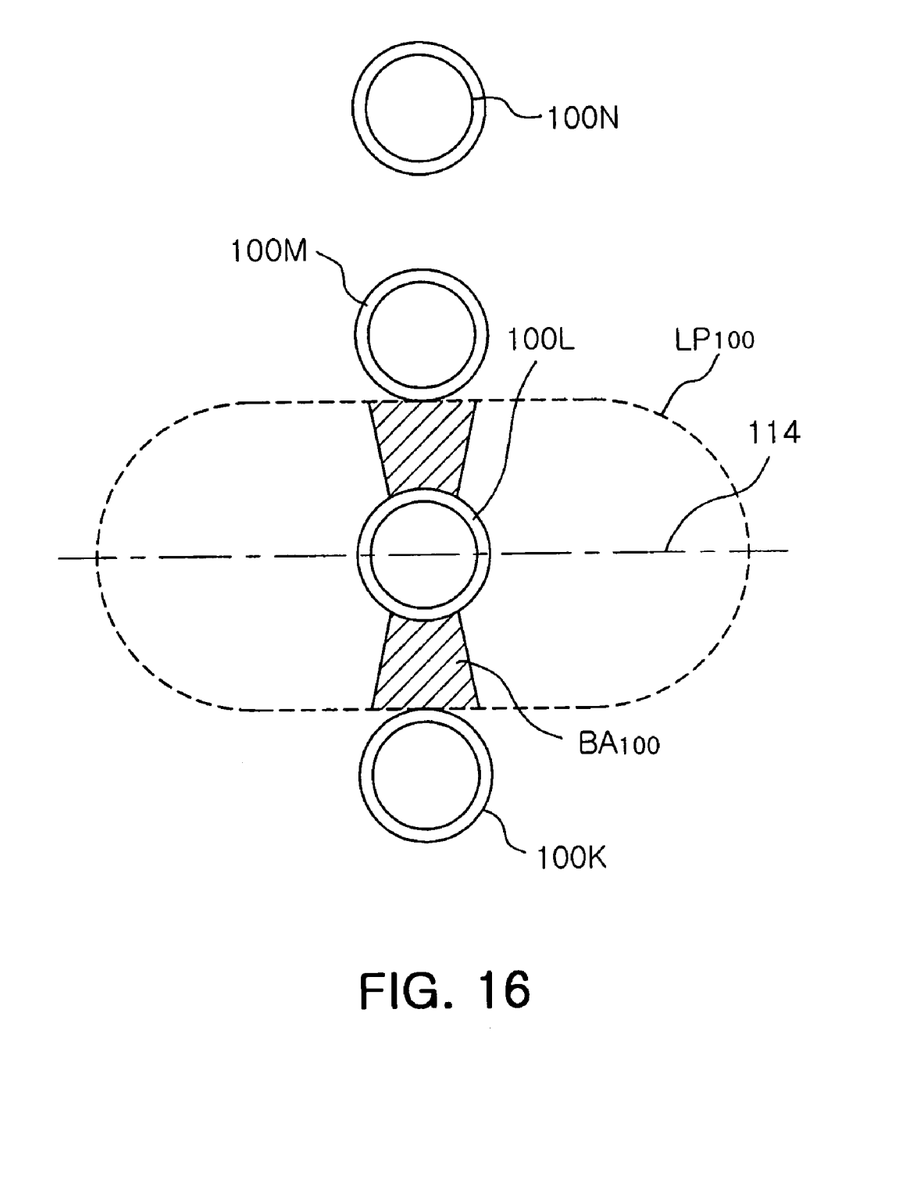
FIG. 16 is a plan view of an LED array having a plurality of LED lenses according to the invention.

FIG. 16 is a plan view of an LED array having a plurality of LED lenses according to the invention. The advantages of the invention that can be found from FIG. 16 will be described with reference to FIG. 12.

An LED array includes plurality of LED lenses 100K, 100L, 100M, 100N and so on of the invention are arranged into a specific pattern. An LED lens 100L of this LED array has a substantially elliptic light pattern $LP_{100}$, which is extended along the axial line 114 and shaped by combining the light patterns LP1 and LP2 as shown in FIG. 12.

In the light pattern $LP_{100}$ as above, a portion of the light pattern directly collides against adjacent LED lenses 100M and 100K, so that the LED lenses 100M and 100 screen the light pattern portion thereby forming blocked areas BA100. However, since the light pattern $LP_{100}$ is shaped to extend along the axis 114, light quantity propagating toward the LED lenses 100M and 100K is reduced compared to that of the conventional LED lenses 10 as shown in FIG. 2. This as a result can reduce light loss by the blocked areas BA100 to a large quantity compared to that by the conventional blocked areas BA10 as shown in FIG. 2, thereby to remarkably improve the efficiency of the entire LED array.

Then, since light quantity directed from one LED array toward any adjacent LED array opposed thereto is increased, it is possible to increase the distance between the LED arrays without reducing resultant light quantity. This as a result can reduce the number of LEDs used in an LCD backlight unit and thus the size of the LCD backlight unit.

Figure 17:
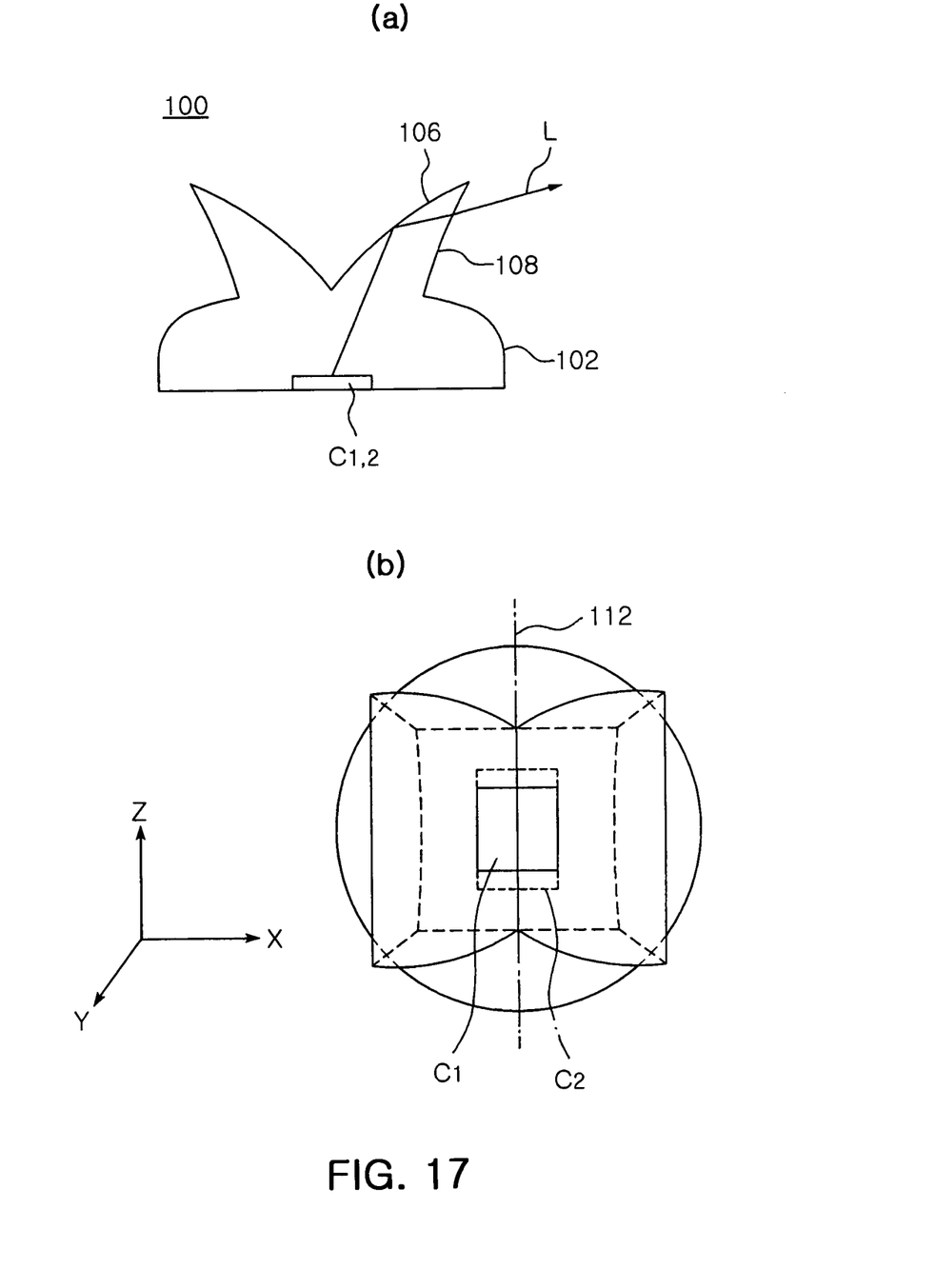
FIG. 17 is cross-sectional and plan views of an LED lens of the invention for illustrating the enlargement of an LED chip.

FIG. 17 is cross-sectional and plan views of an LED lens of the invention for illustrating the enlargement of an LED chip. The advantages of the invention which can be found from FIG. 17 will be described in comparison with FIG. 3 above.

In case of high power LEDs, it is frequently required to increase LED chip size over conventional one in order to reduce current density thereby improving luminous efficiency.

In the prior art, when the LED chip 2a is enlarged, light beams L2 generated from the periphery of the enlarged LED chip 2a are out of total reflection condition even though the lens 156 is increased in any directions. Then, the light beams L2 are radiated upward without being reflected from the reflecting surfaces I.

However, in case of the LED lens 100 of the invention, the problem of the prior art does not take place when an LED chip C2 is enlarged along the vertical imaginary plane 112 from an LED chip C1. That is, when the LED chip C2 is enlarged along the vertical imaginary plane 112, enlarged chip portions (depicted with dotted lines) have the same conditions as a conventional LED chip C1 portion with respect to the interface between the reflecting surfaces 106. This as a result does not increase a probability of light beams from the enlarged chip portions to be out of total reflection condition and thus emitted upward than before the enlargement. Therefore, applying the LED lens 100 of the invention can increase the size of the LED chip C2 in order to lower current density thereby improving luminous efficiency. At the same time, this can prevent the size-enlargement of the LED lens 100 and resultant thickness-increase of an LCD backlight module.

According to the dipolar LED and the LED module incorporating the same of the invention as described above, when light beams are emitted from an LED array having a plurality of LED lenses, light emission from an LED chip can be concentrated mainly in both lateral directions in order to prevent any blocked areas from being formed between adjacent LED lenses.

Furthermore, since the dipolar LED and the LED module incorporating the same can concentrate light emission from an LED chip mainly in both lateral directions, an LED chip can be enlarged in a direction substantially perpendicular to the concentrated light emission thereby lowering current density in high power conditions and thus improving luminous efficiency.

While the present invention has been shown and described in connection with the preferred embodiments, it will be apparent to those skilled in the art that modifications and variations can be made without departing from the spirit and scope of the invention as defined by the appended claims.

What is claimed is:

1. A dipolar Light Emitting Diode (LED) lens comprising:
   an upper hemisphere-shaped base housing an LED chip therein and adapted to radiate light from the LED chip to the outside;
   a pair of symmetric reflecting surfaces, each reflecting surface having a proximal end placed on top of the base and a distal end extended upward and away from the base, with the proximal ends of the reflecting surfaces meeting each other in the form of a joint line on the top of the base, forming a V-shaped valley extended along the joint line between the reflecting surfaces, whereby light from the LED chip is reflected by the reflecting surfaces in a dipolar pattern symmetric about the joint line; and a pair of symmetric radiating surfaces placed outside the reflecting surfaces, respectively, to radiate light from the reflecting surfaces to the outside, thereby forming a peanut-shaped light radiation pattern.

2. The dipolar LED lens according to claim 1, further comprising triangular side surfaces confined by the reflecting surfaces, the radiating surfaces and the base top portions.

3. The dipolar LED lens according to claim 1, wherein the reflecting surfaces are curved downward.

4. The dipolar LED lens according to claim 1, wherein the reflecting surfaces are curved upward.

5. The dipolar LED lens according to claim 1, wherein the reflecting surfaces are planar.

6. The dipolar LED lens according to claim 1, wherein the reflecting surfaces are widened as extending away from the base top portions.

7. The dipolar LED lens according to claim 1, wherein the base has a hemispheric space formed in a lower part thereof, the space being opened downward at a uniform curvature.

8. A dipolar Light Emitting Diode (LED) module comprising:
   an LED chip;
   a board mounted with the LED chip;
   a power-connecting unit for electrically connecting the LED chip with an external power source; and
   an LED lens for sealing the LED chip therein and radiating light from the LED chip to the outside, wherein the LED lens includes:
      an upper hemisphere-shaped base housing the LED chip therein and adapted to radiate light from the LED chip to the outside;
      a pair of symmetric reflecting surfaces, each reflecting surface having a proximal end placed on top of the base and a distal end extended upward and away from of the base, with the proximal ends of the reflecting surfaces meeting each other in the form of a joint line on the top of the base, forming a V-shaped valley extended along the joint line between the reflecting surfaces, whereby light from the LED chip is reflected by the reflecting surfaces in a dipolar pattern symmetric about the joint line; and
      a pair of symmetric radiating surfaces placed outside the reflecting surfaces, respectively, to radiate light from the reflecting surfaces to the outside, thereby forming a peanut-shaped light radiation pattern.

9. The dipolar LED module according to claim 8, wherein the base has a hemispheric space formed in a lower part thereof, the space being opened downward at a uniform curvature.

10. The dipolar LED module according to claim 9, further comprising an encapsulant housing the LED chip within the space of the base and integrally bonded with the LED chip, the encapsulant having a curvature matching that of the space.

11. The dipolar LED module according to claim 10, wherein the encapsulant comprises polymer having a refractive index of about 1.45 to 1.65.

12. The dipolar LED module according to claim 11, wherein the encapsulant comprises nano-sized particles uniformly dispersed through the polymer, the nano-sized particles having a refractive index of about 2.2 to 3.5.

13. The dipolar LED module according to claim 10, wherein the lens is provided as a separate piece from the encapsulant.

14. The dipolar LED module according to claim 8, further comprising an encapsulant placed inside the lens to house the LED chip and integrally bonded with the LED chip.

15. The dipolar LED module according to claim 14, wherein the encapsulant comprises polymer having a refractive index of about 1.45 to 1.65.

16. The dipolar LED module according to claim 15, wherein the encapsulant comprises nano-sized particles uniformly dispersed through the polymer, the nano-sized particles having a refractive index of about 2.2 to 3.5.

17. The dipolar LED module according to claim 8, wherein the LED lens further includes triangular side surfaces confined by the reflecting surfaces, the radiating surfaces and the base top portions.

18. The dipolar LED module according to claim 17, wherein the base has a hemispheric space formed in a lower part thereof, the space being opened downward at a uniform curvature.

19. The dipolar LED module according to claim 18, further comprising an encapsulant housing the LED chip within the space of the base and integrally bonded with the LED chip, the encapsulant having a curvature matching that of the space.

20. The dipolar LED module according to claim 17, further comprising an encapsulant placed inside the lens to house the LED chip and integrally bonded with the LED chip.

* * * * *